(12) United States Patent
Ren et al.

(10) Patent No.: US 11,721,521 B2
(45) Date of Patent: *Aug. 8, 2023

(54) MULTI-BEAM INSPECTION APPARATUS WITH IMPROVED DETECTION PERFORMANCE OF SIGNAL ELECTRONS

(71) Applicant: ASML Netherlands B.V., Veldhoven (NL)

(72) Inventors: Weiming Ren, San Jose, CA (US); Xuedong Liu, San Jose, CA (US); Xuerang Hu, San Jose, CA (US); Zhong-wei Chen, San Jose, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 17/697,842

(22) Filed: Mar. 17, 2022

(65) Prior Publication Data

US 2022/0319808 A1 Oct. 6, 2022

Related U.S. Application Data

(63) Continuation of application No. 17/146,409, filed on Jan. 11, 2021, now Pat. No. 11,282,675, which is a
(Continued)

(51) Int. Cl.
*H01J 37/31* (2006.01)
*H01J 37/14* (2006.01)
(Continued)

(52) U.S. Cl.
CPC .......... *H01J 37/3177* (2013.01); *B82Y 10/00* (2013.01); *B82Y 40/00* (2013.01); *H01J 37/1471* (2013.01);
(Continued)

(58) Field of Classification Search
CPC ............... H01J 37/3177; H01J 37/1471; H01J 37/1472; H01J 37/28; H01J 37/3007;
(Continued)

(56) References Cited

U.S. PATENT DOCUMENTS 5,892,224 A 4/1999 Nakasuji
6,479,819 B1 11/2002 Hamashima et al.
(Continued)

FOREIGN PATENT DOCUMENTS

CN 1630926 A 6/2005
CN 108738343 A 11/2018
(Continued)

OTHER PUBLICATIONS

Notice of Reason(s) for Refusal from the Korean Patent Office issued in related Korean Patent Application No. 10-2020-7025913; dated May 24, 2022 (7 pgs.).
(Continued)

*Primary Examiner* — Nicole M Ippolito
(74) *Attorney, Agent, or Firm* — Finnegan, Henderson, Farabow, Garrett & Dunner, LLP

(57) ABSTRACT

The present disclosure proposes a crossover-forming deflector array of an electro-optical system for directing a plurality of electron beams onto an electron detection device. The crossover-forming deflector array includes a plurality of crossover-forming deflectors positioned at or at least near an image plane of a set of one or more electro-optical lenses of the electro-optical system, wherein each crossover-forming deflector is aligned with a corresponding electron beam of the plurality of electron beams.

24 Claims, 11 Drawing Sheets

Related U.S. Application Data continuation of application No. 16/295,971, filed on Mar. 7, 2019, now Pat. No. 10,892,138.

(60) Provisional application No. 62/641,204, filed on Mar. 9, 2018.

(51) Int. Cl.
| | | |
|---|---|---|
| *H01J 37/30* | (2006.01) | |
| *H01J 37/28* | (2006.01) | |
| *B82Y 10/00* | (2011.01) | |
| *B82Y 40/00* | (2011.01) | |
| *H01J 37/317* | (2006.01) | |
| *H01J 37/147* | (2006.01) | |

(52) U.S. Cl.
CPC .......... *H01J 37/1472* (2013.01); *H01J 37/28* (2013.01); *H01J 37/3007* (2013.01); *H01J 2237/151* (2013.01); *H01J 2237/1501* (2013.01); *H01J 2237/1508* (2013.01); *H01J 2237/2446* (2013.01); *H01J 2237/2448* (2013.01); *H01J 2237/24475* (2013.01); *H01J 2237/2804* (2013.01); *H01J 2237/2817* (2013.01)

(58) Field of Classification Search
CPC ....... H01J 2237/1501; H01J 2237/1508; H01J 2237/151; H01J 2237/2446; H01J 2237/24475; H01J 2237/2448; H01J 2237/2804; H01J 2237/2817
USPC .... 250/396 R, 397, 306, 307, 309, 310, 311, 250/492.1, 492.2, 492.21, 492.22, 492.23, 250/492.3
See application file for complete search history.

(56) References Cited

U.S. PATENT DOCUMENTS

| | | | |
|---|---|---|---|
| 9,691,588 B2 | 6/2017 | Ren et al. | |
| 10,062,541 B2 | 8/2018 | Ren et al. | |
| 10,141,160 B2 | 11/2018 | Ren et al. | |
| 10,892,138 B2 * | 1/2021 | Ren | H01J 37/1472 |
| 11,282,675 B2 * | 3/2022 | Ren | H01J 37/3007 |
| 2005/0214958 A1 | 9/2005 | Nakasuji et al. | |
| 2013/0248731 A1 | 9/2013 | Tanimoto et al. | |
| 2016/0268096 A1 | 9/2016 | Ren et al. | |
| 2017/0025243 A1 | 1/2017 | Ren et al. | |
| 2017/0154756 A1 | 6/2017 | Ren et al. | |
| 2017/0213688 A1 | 7/2017 | Ren et al. | |
| 2017/0316912 A1 | 11/2017 | Zeidler et al. | |
| 2018/0040452 A1 | 2/2018 | Hatakeyama et al. | |
| 2018/0172186 A1 | 6/2018 | Cai | |

FOREIGN PATENT DOCUMENTS

| | | |
|---|---|---|
| EP | 1271605 A1 | 1/2003 |
| EP | 1273907 A1 | 1/2003 |
| EP | 1635374 A1 | 3/2006 |
| JP | 2006339169 | 12/2006 |
| TW | 201515044 A | 4/2015 |
| TW | 201640554 A | 11/2016 |

OTHER PUBLICATIONS

Office Action issued by the ROC (Taiwan) Patent Office in related Application No. 108107385, dated Feb. 27, 2020 (9 Pgs).
PCT International Search Report and written Opinion issued in related PCT Application No. PCT/EP2019/054257, dated Jun. 25, 2019 (3 pgs.).
Office Action of the Intellectual Property Office issued in related Taiwanese Patent Application No. 109143717; dated Aug. 30, 2021 (6 pgs.).
First Office Action issued in related Chinese Patent Application No. 201980017872X; dated Feb. 6, 2023 (9 pgs.).

* cited by examiner

MULTI-BEAM INSPECTION APPARATUS WITH IMPROVED DETECTION PERFORMANCE OF SIGNAL ELECTRONS

CROSS-REFERENCE TO RELATED APPLICATIONS

This application is a continuation of application Ser. No. 17/146,409, filed Jan. 11, 2021, which is a continuation of application Ser. No. 16/295,971, filed Mar. 7, 2019, now U.S. Pat. No. 10,892,138, which claims priority of U.S. application 62/641,204, which was filed on Mar. 9, 2018. The disclosures of the above-referenced applications are incorporated herein by reference in their entireties.

TECHNICAL FIELD

The embodiments provided herein disclose a charged particle apparatus with multiple charged particle beams, and more particularly, an apparatus utilizing multiple charged particle beams to observe or inspect scanned regions of an observed area of a sample surface.

BACKGROUND

When manufacturing semiconductor integrated circuit (IC) chips, pattern defects and/or uninvited particles (residuals) inevitably appear on a wafer and/or a mask during fabrication processes, thereby reducing the yield to a great degree. For example, uninvited particles may be troublesome for patterns with smaller critical feature dimensions, which have been adopted to meet the more and more advanced performance requirements of IC chips.

Currently, pattern inspection tools with a single electron beam are used to detect the defects and/or uninvited particles. These tools typically employ a scanning electron microscope (SEM). In the SEM, a beam of primary electrons having a relatively high energy is decelerated to land on a sample at a relatively low landing energy and is focused to form a probe spot thereon. Due to this focused probe spot of primary electrons, secondary electrons will be generated from the surface. By scanning the probe spot over the sample surface and collecting the secondary electrons, pattern inspection tools may obtain an image of the sample surface.

SUMMARY

The embodiments of the present disclosure provide a charged particle apparatus with multiple charged particle beams, and more particularly, an apparatus utilizing multiple charged particle beams to observe or inspect scanned regions of an observed area of a sample surface.

In some embodiments, a crossover-forming deflector array of an electro-optical system for directing a plurality of electron beams onto an electron detection device is provided. The crossover-forming deflector array includes a plurality of crossover-forming deflectors positioned at or at least near an image plane of a set of one or more electro-optical lenses of the electro-optical system, wherein each crossover-forming deflector is aligned with a corresponding electron beam of the plurality of electron beams.

In some embodiments, an electro-optical system for projecting a plurality of secondary electron beams from a sample onto respective electron detection surfaces in a multi-beam apparatus is provided. The electro-optical system includes a plurality of crossover-forming deflectors configured to create a crossover area on a crossing plane for the plurality of secondary electron beams, wherein each crossover-forming deflector of the plurality of crossover-forming deflectors is associated with a corresponding secondary electron beam of the plurality of secondary electron beams. The electro-optical system can also include a beam-limit aperture plate with one or more apertures, positioned at or near the crossing plane, and configured to trim the plurality of secondary electron beams.

In some embodiment, a method performed by a secondary imaging system to form images of a sample is provided. The method includes deflecting secondary electron beams by a plurality of crossover-forming deflectors being positioned at or at least near one or more image planes of the secondary imaging system to form a crossover area on a crossing plane. The method can also include trimming secondary electron beams by a beam-limit aperture plate with a beam-limit aperture positioned at or at least near the crossing plane.

In some embodiments, a method to form images of a sample using an electro-optical system is provided. The method includes generating a magnetic field to immerse a surface of the sample and projecting a plurality of primary electron beams onto the surface of the sample by a primary projection imaging system, wherein the plurality of primary electron beams pass through the magnetic field and generate a plurality of secondary electron beams from the sample. The method also includes projecting, by a secondary imaging system, the plurality of secondary electron beams onto an electron detection device to obtain the images, wherein at least some of the plurality of secondary electron beams are deflected for creating a crossover area and are trimmed at or at least near to the crossover area.

In some embodiments, a non-transitory computer readable medium is provided. The non-transitory computer readable medium stores a set of instructions that is executable by one or more processors of a controller causing the controller to perform a method to form images of a sample using an electro-optical system. The method includes providing instructions to cause a plurality of crossover-forming deflectors being positioned at or at least near one or more image planes of the system to deflect secondary electron beams to form a crossover area. The method also includes providing instructions to cause a beam-limit aperture to trim the deflected secondary electron beams at or at least near to the crossover area.

In some embodiments, a non-transitory computer readable medium is provided. The non-transitory computer readable medium stores a set of instructions that is executable by one or more processors of a controller causing the controller to perform a method forming images of a sample. The method includes instructing an objective lens to generate a magnetic field to immerse a surface of the sample and instructing a primary imaging system to project a plurality of primary electron beams onto the surface of the sample, wherein the plurality of primary electron beams pass through the magnetic field and generate a plurality of secondary electron beams from the sample. The method also includes instructing a secondary imaging system to project the plurality of secondary electron beams onto an electron detection device to obtain the images, wherein at least some of the plurality of secondary electron beams are deflected for creating a crossover area and are trimmed at or at least near the crossover area.

Other advantages of the present invention will become apparent from the following description taken in conjunction with the accompanying drawings wherein are set forth, by way of illustration and example, certain embodiments of the present invention.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims.

Relative dimensions of components in drawings may be exaggerated for clarity. Within the following description of drawings the same or like reference numbers refer to the same or like components or entities, and only the differences with respect to the individual embodiments are described.

Without limiting the scope of the protection, all the description and drawings of the embodiments will exemplarily be referred to as an electron beam. However, the embodiments are not used to limit the present invention to specific charged particles.

Figure 1:
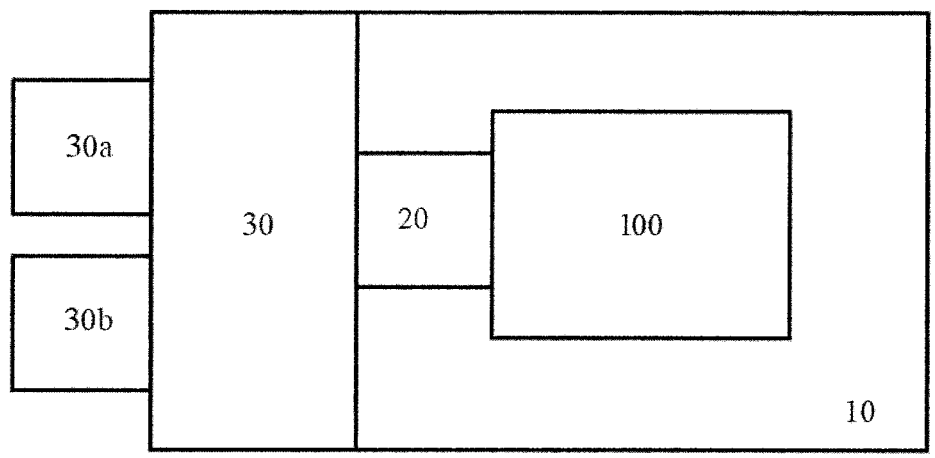
FIG. 1 is a schematic diagram illustrating an exemplary electron beam inspection (EBI) system, consistent with embodiments of the present disclosure.

Reference is now made to FIG. 1, which is a schematic diagram illustrating an exemplary electron beam inspection (EBI) system, consistent with embodiments of the present disclosure. As shown in FIG. 1, charged particle beam inspection system 1 includes a main chamber 10, a load/lock chamber 20, an electron beam tool 100, and an equipment front end module (EFEM) 30. Electron beam tool 100 is located within main chamber 10.

EFEM 30 includes a first loading port 30a and a second loading port 30b. EFEM 30 may include additional loading port(s). First loading port 30a and second loading port 30b may, for example, receive wafer front opening unified pods (FOUPs) that contain wafers (e.g., semiconductor wafers or wafers made of other material(s)) or samples to be inspected (wafers and samples are collectively referred to as "wafers" hereafter). One or more robot arms (not shown) in EFEM 30 transport the wafers to load/lock chamber 20.

Load/lock chamber 20 is connected to a load/lock vacuum pump system (not shown), which removes gas molecules in load/lock chamber 20 to reach a first pressure below the atmospheric pressure. After reaching the first pressure, one or more robot arms (not shown) transport the wafer from load/lock chamber 20 to main chamber 10. Main chamber 10 is connected to a main chamber vacuum pump system (not shown), which removes gas molecules in main chamber 10 to reach a second pressure below the first pressure. After reaching the second pressure, the wafer is subject to inspection by electron beam tool 100. While the present disclosure provides examples of main chamber 10 housing an electron beam inspection system, it should be noted that aspects of the disclosure in their broadest sense, are not limited to a chamber housing an electron beam inspection system. Rather, it is appreciated that the foregoing principles may also be applied to other tools that operate under the second pressure.

Figure 2:
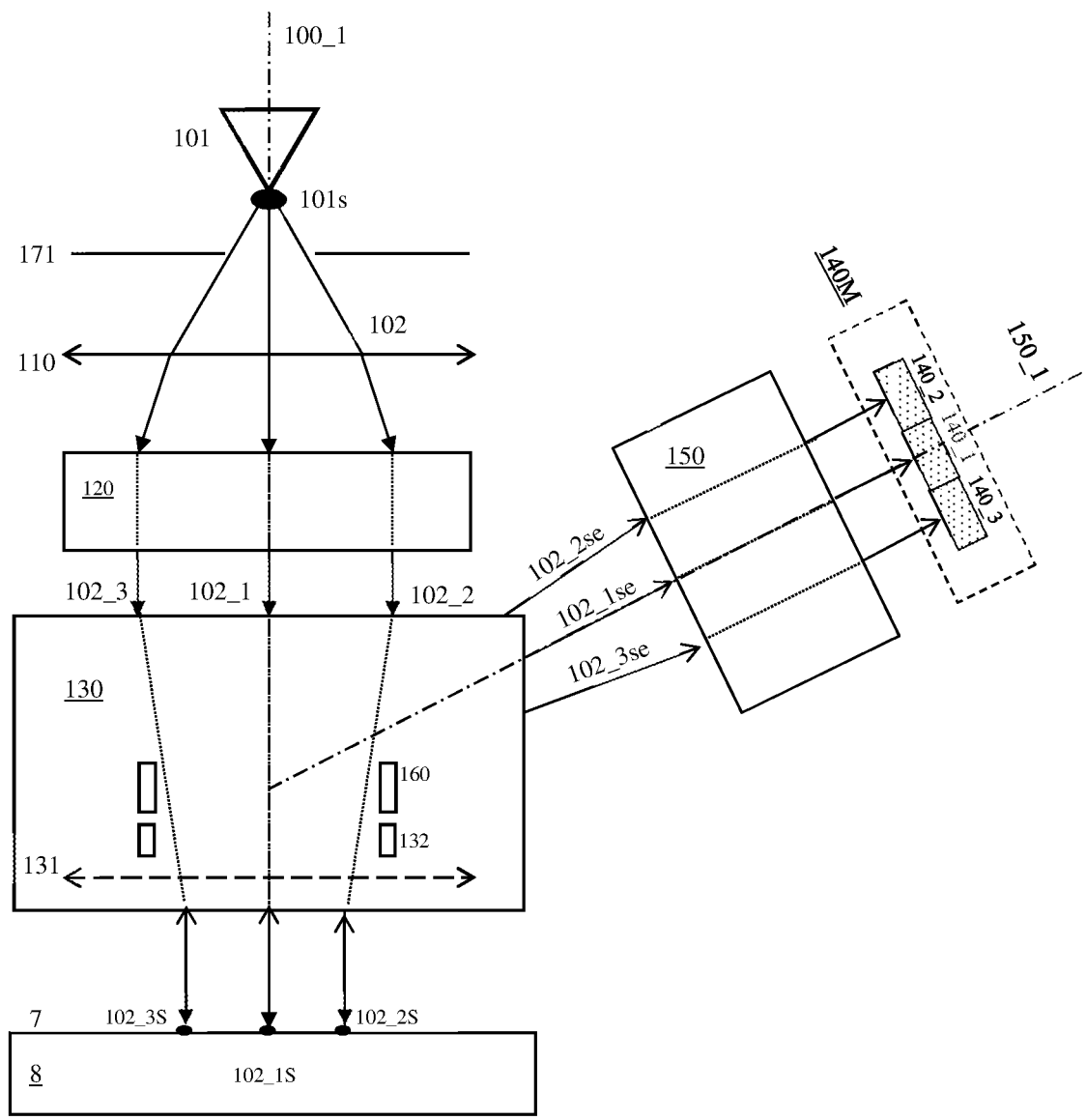
FIG. 2 is a schematic diagram illustrating an exemplary electron beam tool that is part of the exemplary electron beam inspection system of FIG. 1, consistent with embodiments of the present disclosure.

Reference is now made to FIG. 2, which is a schematic diagram illustrating an exemplary electron beam tool 100 that is part of the exemplary electron beam inspection system of FIG. 1, consistent with embodiments of the present disclosure. An electron beam tool 100 (also referred to herein as apparatus 100) comprises an electron source 101, a gun aperture plate 171, a condenser lens 110, a source conversion unit 120, a primary projection optical system 130, a sample 8 with sample surface 7, a secondary imaging system 150, and an electron detection device 140M. Primary projection optical system 130 may comprise an objective lens 131. Electron detection device 140M may comprise a plurality of detection elements 140_1, 140_2, and 140_3. A beam separator 160 and a deflection scanning unit 132 may be placed inside primary projection optical system 130.

Electron source 101, gun aperture plate 171, condenser lens 110, source conversion unit 120, beam separator 160, deflection scanning unit 132, and primary projection optical system 130 may be aligned with a primary optical axis 100_1 of apparatus 100. Secondary imaging system 150 and electron detection device 140M may be aligned with a secondary optical axis 150_1 of apparatus 100.

Electron source 101 may comprise a cathode (not shown) and an extractor and/or anode (not shown), in which, during operation, electron source 101 is configured to emit primary electrons from the cathode and the primary electrons are extracted and/or accelerated by the extractor and/or the anode to form a primary electron beam 102 that forms a primary beam crossover (virtual or real) 101s. Primary electron beam 102 may be visualized as being emitted from primary beam crossover 101s.

Source conversion unit 120 may comprise an image-forming element array (not shown in FIG. 2) and a beam-limit aperture array (not shown in FIG. 2). An example of source conversion unit 120 may be found in U.S. Pat. No. 9,691,586; U.S. application Ser. No. 15/216,258; and International Application No. PCT/EP2017/084429, all of which are incorporated by reference in their entireties. The image-forming element array may comprise a plurality of micro-deflectors and/or micro-lenses to influence a plurality of primary beamlets 102_1, 102_2, 102_3 of primary electron beam 102 and to form a plurality of parallel images (virtual or real) of primary beam crossover 101s, one for each of the primary beamlets 102_1, 201_2, 102_3. The beam-limit aperture array may be configured to limit diameters of individual primary beamlets 102_1, 102_2, and 102_3. FIG. 2 shows three primary beamlets 102_1, 102_2, and 102_3 as an example, and it is appreciated that source conversion unit 120 may be configured to form any number of primary beamlets.

Condenser lens 110 is configured to focus primary electron beam 102. Condenser lens 110 may further be configured to adjust electric currents of primary beamlets 102_1, 102_2, and 102_3 downstream of source conversion unit 120 by varying the focusing power of condenser lens 110. Alternatively, the electric currents may be changed by altering the radial sizes of beam-limit apertures within the beam-limit aperture array corresponding to the individual primary beamlets. Objective lens 131 (further explained below) may be configured to focus beamlets 102_1, 102_2, and 102_3 onto a sample 8 for inspection and may form, in the current embodiments, three probe spots 102_1s, 102_2s, and 102_3s on surface 7. Gun aperture plate 171, in operation, is configured to block off peripheral electrons of primary electron beam 102 to reduce Coulomb effect. The Coulomb effect may enlarge the size of each of probe spots 102_1s, 102_2s, and 102_3s of primary beamlets 102_1, 102_2, 102_3, and therefore deteriorate inspection resolution.

Beam separator 160 may, for example, be a Wien filter comprising an electrostatic deflector generating an electrostatic dipole field E1 and a magnetic dipole field B1 (both of which are not shown in FIG. 2). In operation, beam separator 160 may be configured to exert an electrostatic force by electrostatic dipole field E1 on individual electrons of primary beamlets 102_1, 102_2, and 102_3. The electrostatic force is equal in magnitude but opposite in direction to the magnetic force exerted by magnetic dipole field B1 of beam separator 160 on the individual electrons. Primary beamlets 102_1, 102_2, and 102_3 may therefore pass at least substantially straight through beam separator 160 with at least substantially zero deflection angles.

Deflection scanning unit 132, in operation, is configured to deflect primary beamlets 102_1, 102_2, and 102_3 to scan probe spots 102_1s, 102_2s, and 102_3s across individual scanning areas in a section of surface 7. In response to incidence of primary beamlets 102_1, 102_2, and 102_3 at probe spots 102_1s, 102_2s, and 102_3s, electrons emerge from sample 8 and generate three secondary electron beams 102_1se, 102_2se, and 102_3se, which, in operation, are emitted from sample 8. Each of secondary electron beams 102_1se, 102_2se, and 102_3se typically comprise electrons having different energies including secondary electrons (having electron energy ≤50 eV) and backscattered electrons (having electron energy between 50 eV and the landing energy of primary beamlets 102_1, 102_2, and 102_3). Beam separator 160 is configured to deflect secondary electron beams 102_1se, 102_2se, and 102_3se towards secondary imaging system 150. Secondary imaging system 150 subsequently focuses secondary electron beams 102_1se, 102_2se, and 102_3se onto detection elements 140_1, 140_2, and 140_3 of electron detection device 140M. Detection elements 140_1, 140_2, and 140_3 are arranged to detect corresponding secondary electron beams 102_1se, 102_2se, and 102_3se and generate corresponding signals which are sent to signal processing units (not shown), e.g. to construct images of the corresponding scanned areas of sample 8.

Figure 3A:
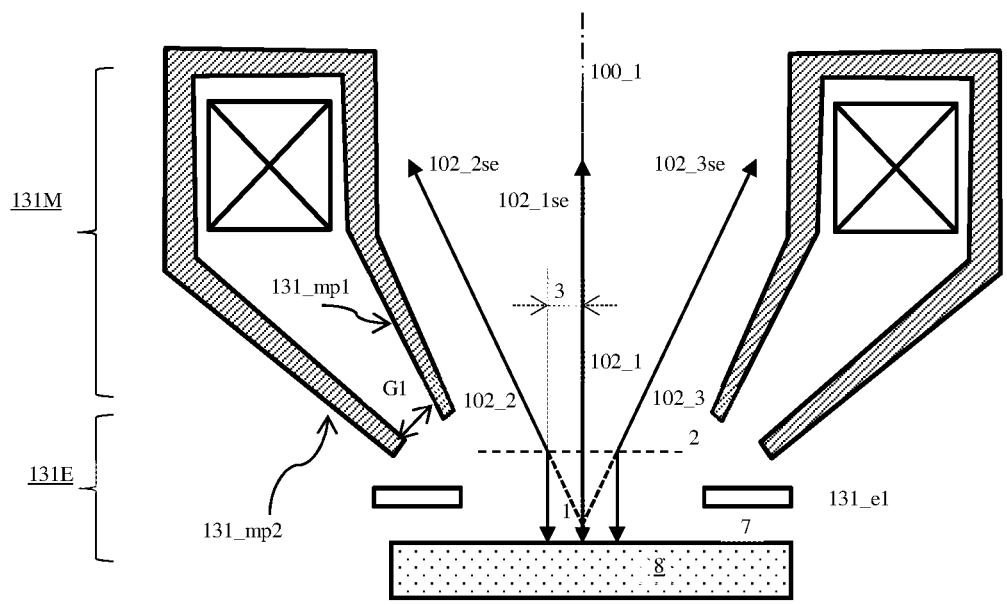
FIG. 3A is a schematic diagram illustrating an exemplary configuration of objective lens having a magnetic lens and an electrostatic lens.

Reference is now made to FIG. 3A, which illustrates an exemplary configuration of objective lens 131 of FIG. 2. To obtain a higher resolution of images formed by primary beamlets 102_1, 102_2, and 102_3, objective lens 131 may be an electromagnetic compound lens in which the sample may be immersed in the magnetic field of objective lens 131.

In some embodiments, objective lens 131 includes a magnetic lens 131M and an electrostatic lens 131E. Magnetic lens 131M includes a magnetic-circuit gap G1 between pole-pieces 131_mp1 and 131_mp2. Magnetic lens 131M is configured to focus each primary beamlet 102_1, 102_2, and 102_3 at relatively low aberrations to generate relatively small probe spots 102_1s, 102_2s, 102_3s of each of primary beamlets 102_1, 102_2, 102_3 on sample 8.

In some embodiments, electrostatic lens 131E is formed by pole-piece 131_mp1 and/or pole-piece 131_mp2 of magnetic lens 131M, field-control electrode 131_e1, and sample 8. Electrostatic lens 131E is configured to influence the landing energy of each primary beamlet 102_1, 102_2, and 102_3 to ensure that the primary electrons land on sample 8 at a relatively low kinetic energy and pass through the apparatus with a relatively high kinetic energy.

Figure 3B:
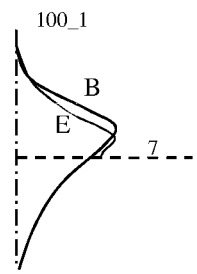
FIG. 3B illustrates exemplary magnetic field and electrostatic field of the magnetic lens and the electrostatic lens, respectively, of FIG. 3A.

In some embodiments, objective lens 131 is configured to be an "immersion lens." As a result, sample 8 is immersed both in an electrostatic field E (electrostatic immersion) of electrostatic lens 131E and a magnetic field B (magnetic immersion) of magnetic lens 131M, as shown in FIG. 3B. Magnetic immersion may occur when a ratio of the magnetic field strength on surface 7 and the peak magnetic field strength is larger than a preset ratio value, such as 5%. In some embodiments, sample 8 may not be immersed in magnetic field B.

Electrostatic immersion and magnetic immersion may reduce aberrations of objective lens 131. As electrostatic and magnetic fields get stronger, the aberrations of objective lens 131 become smaller. Electrostatic field E, however, should be limited to within a safe range in order to avoid discharging or arcing on sample 8. Field-control electrode 131_e1 of FIG. 3A may be configured to control electrostatic field E to stay within that safe range. Due to this limitation of the field strength of electrostatic field E, further enhancement of the magnetic field strength in the current immersion configuration allows to further reduce the aberrations of objective lens 131, and thereby improve image resolution.

In some embodiments, primary beamlets 102_1, 102_2, 102_3 may arrive on sample surface 7 in an at least substantially perpendicular direction. Magnetic immersion, however, may influence the landing angles of all primary beamlets landing on sample surface 7. In particular, magnetic field B may cause each electron in a primary beamlet to obtain an angular velocity $\theta^{(1)}$, as shown in equation (1) below:

$$r^2\theta^{(1)} = \frac{1}{2}\frac{e}{m}r^2B + C \qquad \text{(Equation 1)}$$

wherein C is a constant related to an initial angular velocity of the electron, r is a position shift from optical axis of objective lens 131, and e and m are the charge and the mass of the electron, respectively. For the electron to land on surface 7 in a perpendicular manner, angular velocity $\theta^{(1)}$ must be zero on sample surface 7.

In some embodiments, magnetic lens 131M is configured to operate in a non-magnetic immersion mode, and magnetic field B is zero (or substantially zero) or below the preset ratio value on surface 7. If an electron enters magnetic field B along a meridional path, its corresponding constant C is zero and its angular velocity $\theta^{(1)}$ will be zero or substantially zero on sample 8. Furthermore, if an electron enters magnetic field B along a specific meridional path, it can cross optical axis 100_1 of magnetic lens 131M before entering magnetic lens 131M and perpendicularly land on sample 8. In other words, objective lens 131 has a real front focal point on its front focal plane. When the chief rays (or center rays) of off-axis primary beamlets 102_2 and 102_3 enter objective lens 131 along some specific meridional paths, the chief rays can pass through the real front focal point and off-axis primary beamlets 102_2 and 102_3 can land on surface 7 perpendicular. Accordingly, primary beamlets 102_1, 102_2 and 102_3 overlap together on the front focal plane and form a relatively sharp beamlet crossover centering at the real front focal point.

In other embodiments, magnetic lens 131M is configured to operate in magnetic immersion mode in which magnetic field B is not zero on surface 7. Therefore, angular velocity $\theta^{(1)}$ of an electron may be zero (or substantially zero) on sample 8 if its corresponding constant C is not zero when the electron enters magnetic field B and complies with the condition in equation (2):

$$C = -\frac{1}{2}\frac{e}{m}r^2B \qquad \text{(Equation 2)}$$

When C is not equal to zero, the electron enters magnetic field B along a skew path and cannot cross optical axis 100_1 of magnetic lens 131M before entering magnetic field B. Hence, an electron can perpendicularly land on sample 8 only if entering magnetic field B along a specific skew path, and the electron cannot really cross optical axis 100_1 during passing through magnetic field B. Accordingly objective lens 131 has a virtual front focal point 1. When the chief rays (or center rays) of off-axis primary beamlets 102_2 and 102_3 enter objective lens 131 along some specific skew paths, they can virtually pass through virtual front focal point 1 and land on sample surface 7 perpendicular. Under this scenario, off-axis primary beamlets 102_2 and 102_3 are closest to each other on principal plane 2 of objective lens 131, and each off-axis primary beamlets 102_2 and 102_3 has a radial shift 3 from optical axis 100_1. The primary beamlets 102_1-102_3 therefore only partially overlap with each other on principal plane 2 and form a partial-overlap beamlet crossover on principal plane 2. Moreover, radial shift 3 increases as magnetic field B on surface 7 increases. Current density is lower in the partial-overlap beamlet crossover than in the foregoing sharp beamlet crossover. Therefore, the Coulomb interaction between primary beamlets 102_1, 102_2, and 102_3 in magnetic immersion mode is relatively low, thereby further contributing to the small sizes of probe spots 102_1S-102_3S.

As mentioned above, when objective lens 131 operates in magnetic immersion mode, chief rays of off-axis primary beamlets 102_2 and 103_3 are required to enter magnetic field B or objective lens 131 along some specific skew paths so that off-axis primary beamlets 102_2 and 102-3 can land on sample 8 perpendicularly. The corresponding constants C of the off-axis chief rays are determined by equation (2). A deflector can be used to adjust a primary beamlet to enter objective lens 131 along its corresponding specific skew path. For example, micro-deflectors in source-conversion unit 120 may be used to individually deflect off-axis primary beamlets 102_2 and 102_3 to eliminate the angular velocities of those beamlets on surface 7 so that those beamlets land on surface 7 perpendicularly.

For secondary electron emissions from a sample surface, the angular distribution follows Lambert's law. That is, the angular distribution is proportional to cos φ, where φ is the emission angle relative to the surface normal. Therefore, the chief rays of off-axis secondary electron beams 102_2se and 102_3se in FIG. 3A perpendicularly depart from sample surface 7 and are thereby meridional (i.e., C=0). Accordingly, the chief rays of off-axis secondary electron beams 102_2se, 102_3se have angular velocities as shown in equation (3).

$$\theta^{(1)} = \frac{1}{2}\frac{e}{m}B \qquad \text{(Equation 3)}$$

In some embodiments in which magnetic field B is zero at the sample surface, objective lens 131 works in non-magnetic immersion mode. Accordingly, angular velocity $\theta^{(1)}$ of the emerging secondary electrons would also be zero on the sample surface. In such embodiments, the chief rays of off-axis secondary electron beams 102_2se and 102_3se are still meridional after exiting objective lens 131, and may be able to cross optical axis 150_1 of secondary imaging system 150 (not shown in FIG. 2). Furthermore, the chief rays can cross optical axis 150_1 at a same place (if aberrations are not considered) in secondary imaging system 150. As such, secondary electron beams 102_1se-102_3se may be configured to overlap at a common area of crossing and therefore form a relatively sharp secondary beam crossover. The plane where the common area of crossing or secondary beam crossover is located is referred to as a crossing plane.

Figure 3D:
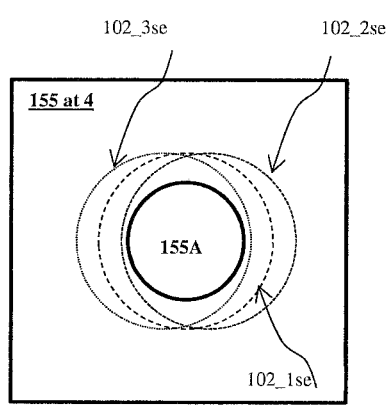
FIG. 3D is a cross sectional diagram of a beam-limit aperture plate of a secondary imaging system.
Figure 4A:
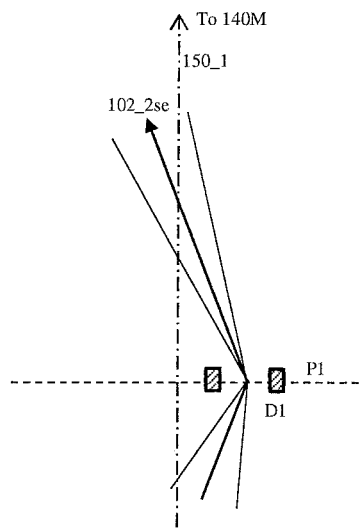
FIG. 4A is a schematic diagram illustrating an exemplary deflector of a secondary imaging system, consistent with embodiments of the present disclosure.
Figure 4B:
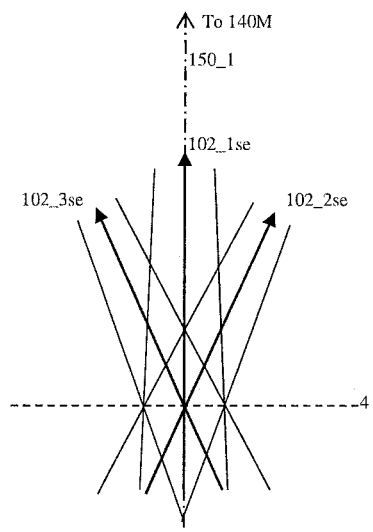
FIG. 4B is a schematic diagram illustrating an exemplary crossover of secondary electron beams at a secondary imaging system, consistent with embodiments of the present disclosure.
Figure 4C:
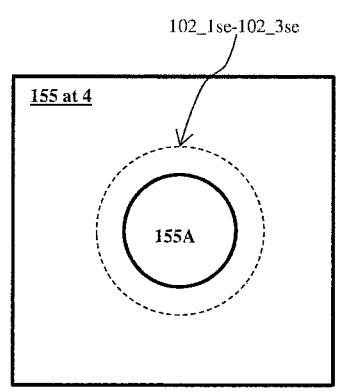
FIG. 4C is a cross sectional diagram of a beam-limit aperture plate of a secondary imaging system, consistent with embodiments of the present disclosure.

When objective lens operates in the non-magnetic immersion mode, a secondary beam-limit aperture plate (e.g., secondary beam-limit aperture plate 155 shown in FIGS. 3D, 4C) with a secondary beam-limit aperture (e.g., secondary beam-limit aperture 155A shown in FIGS. 3D, 4C) in secondary imaging system 150 may be placed at the crossing plane such that secondary electron beams 102_1se-102_3se may pass through the secondary beam-limit aperture in a substantially same manner similar to the exemplary embodiment of FIG. 4C. In such a scenario, the secondary beam-limit aperture cuts off peripheral electrons of secondary electron beams 102_1se-102_3se in a substantially uniform manner. By cutting off the peripheral electrons in the substantially uniform manner, the secondary beam-limit aperture may allow secondary electron beams 102_1se-102_3se to have the same or at least similar passing rates and therefore assist electron detection device 140M with relatively high collection efficiency uniformity across the detected secondary electron beams 102_1se-102_3se. Moreover, cutting off the peripheral elections in the substantially uniform manner (e.g., using the same blocking effects in any radial directions) reduces cross talk of the secondary electron beams on electron detection device 140M.

In alternative embodiments when magnetic field B is not zero at substrate surface 7, objective lens 131 operates in magnetic immersion mode. Accordingly, angular velocity $\theta^{(1)}$ of the emerging secondary electrons is not zero on the sample surface. The chief rays of off-axis secondary electron beams 102_2se and 102_3se have angular velocities after exiting objective lens, and will be skew rays.

Figure 3C:
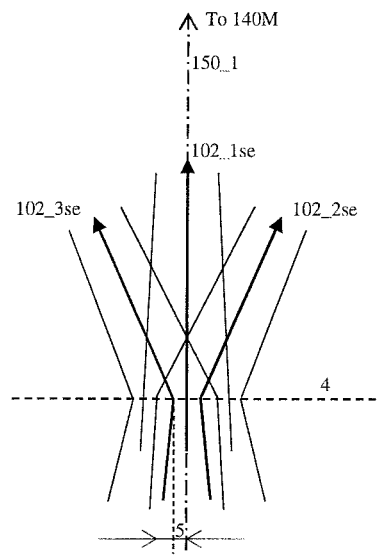
FIG. 3C is a schematic diagram illustrating an exemplary secondary electron beams that have been influenced by the objective lens.

Reference is now made to FIGS. 3C and 3D, which illustrate how operating under magnetic immersion mode may affect secondary electron beams. In particular, FIG. 3C shows a schematic diagram of exemplary secondary electron beams that emerge from surface 7 of sample 8 and are influenced by objective lens 131 (not shown), while FIG. 3D shows a cross sectional diagram of a beam-limit aperture plate of a secondary imaging system 151. In these alternative embodiments, the chief rays of off-axis secondary beams 102_2se and 102_3se become skewed such that they no longer cross optical axis 150_1 of secondary imaging system 150. For example, as shown in FIG. 3C, secondary electron beams 102_1se-102_3se only partially overlap in one or more crossing planes (such as crossing plane 4) in secondary imaging system 150 and form a partial-overlap secondary beam crossover at each of the crossing planes. At crossing plane 4, the chief rays of off-axis secondary electron beams 102_2se and 102_3se have a radial shift 5 from optical axis 150_1. As magnetic field B increases, the separation of off-axis secondary electron beams 102_2se and 102_3se from optical axis 150_1 (and on-axis secondary electron beam 102_1se) becomes larger, thereby further reducing the amount of overlap across secondary electron beams 102_1se-102_3se.

In these embodiments, as shown in FIG. 3D, secondary beam-limit aperture 155A in secondary imaging system 150 is placed at one partially-overlapping secondary beam crossover on the corresponding crossing plane. As shown in FIG. 3D, the lack of a common crossing point of the chief rays of the secondary electron beams causes second beam-limit aperture 155A to cut off different parts of the peripheral electrons from different secondary electron beams 102_1se-102_3se. On-axis secondary electron beam 102_1se has a higher passing rate compared to off-axis secondary electron beams 102_2se and 102_3se. While peripheral electrons of on-axis secondary electron beam 102_1se are uniformly cut off in all azimuths, the peripheral electrons of off-axis secondary electron beams 102_2se and 102_3se cannot be uniformly cut off in all azimuths. For example, for secondary electron beam 102_2se, more peripheral electrons are cut off on the right side than on the left side. Thus, when using an objective lens in an immersion configuration, differences of collection efficiencies of secondary electron beams 102_1se-102_3se may occur and the cross-talk among secondary electron beams 102_1se-102_3se may be larger (when compared to objective lens operating in the non-magnetic immersion mode).

Accordingly, when objective lens 131 operates in magnetic immersion mode, the secondary imaging system has a reduced Coulomb Effect, although collection efficiency uniformity and cross-talk across secondary electron beams at electron detection device 140M may be negatively impacted. The disclosed embodiments provide a system, while operating in magnetic immersion mode, that is configured to minimize radial shifts of off-axis secondary electron beams at a common area of crossing such that a secondary beam-limit aperture may be placed at the common area of crossing to evenly reduce the peripheral electrons for all secondary electron beams. The disclosed embodiments are configured to reduce the cross-talk and improve collection efficiency uniformity for the secondary electron beams.

Reference is now made to FIG. 4A, which illustrates an exemplary deflector used by a secondary imaging system, consistent with embodiments of the present disclosure. The secondary imaging system (e.g., secondary imaging system 150 of FIG. 2) may include a deflector D1 to deflect a secondary electron beam 102_2se to reduce the angular velocity of the chief ray of secondary electron beam 102_2se. As a result, the trajectory of the secondary electron beam may be changed from a skewed trajectory to a meridional trajectory. As a result, the deflected secondary electron beam may be configured to cross secondary optical axis 150_1 at a designed location.

For example, deflector D1 may be placed at least near an image plane P1 of a lens or lens group of secondary imaging system 150 and may be optically aligned with secondary electron beam 102_2se. Such deflector D1 may, for example, be a multi-pole structure. For example, when deflector D1 is a 4-pole structure, a zero voltage is applied to one pair of opposite poles, while two voltages of the same absolute value but opposite polarities are applied to the other pair of opposite poles. As the voltage increases on the opposite poles, the angle of deflection of the beamlet increases as well.

As stated above, deflector D1 is placed at least near image plane P1. In some embodiments, deflector D1 is placed at the image plane P1 of one or more lenses of secondary imaging system 150. In the embodiment in which deflector D1 is near image plane P1, deflection of the secondary electron beam may influence a magnification of the secondary imaging system 150, but this influencing may be acceptable if the influencing remains within certain limits.

Deflector D1 may, for example, be part of a deflector array. Accordingly, for each secondary electron beam, a deflector may be placed at least near to an image plane and optically aligned with the corresponding secondary electron beam. It is appreciated that for an on-axis secondary beam, a corresponding deflector may not be necessary.

The individual deflectors of the deflector array may be configured to deflect their corresponding secondary electron beams to cross secondary optical axis 150_1 at a desired crossing plane (not shown in FIG. 4A) and form a relatively sharp secondary beam crossover thereon. The distance between the deflector and the crossing plane may depend on the secondary beam's deflection angle caused by the deflector. For example, as shown in FIG. 4A, deflector D1 deflects off-axis secondary electron beam 102_2se such that the chief ray of secondary electron beam 102_2se crosses secondary optical axis 150_1 at a desired crossing plane.

Reference is now made to FIGS. 4B-4C, which show embodiments that are consistent with embodiments of the present disclosure. FIG. 4B is a schematic diagram illustrating an exemplary relatively sharp secondary beam crossover of secondary electron beams on crossing plane 4 in a secondary imaging system, while FIG. 4C illustrates a cross sectional diagram of an exemplary beam-limit aperture plate on crossing plane 4.

In FIG. 4B, off-axis secondary electron beams 102_2se and 102_3se are deflected by their corresponding deflectors (not shown) to cross secondary optical axis 150_1 at crossing plane 4 and form a relatively sharp secondary beam crossover thereon with on-axis secondary electron beam 102_1se. As a result, any beam-limiting aperture placed at the secondary beam crossover may be used to evenly cut off peripheral electrons from the individual secondary electron beams to reduce cross-talk and ensure similar collection efficiencies. This is shown in FIG. 4C.

FIG. 4C shows the cross sectional perspective on crossing plane 4 when secondary electron beams pass through and cross over an opening of secondary beam-limit aperture 155A in beam-limit aperture plate 155 that is placed on crossing plane 4 in FIG. 4B. In FIG. 4C, the dashed circle illustrates the overlapping secondary electron beams 102_1se, 102_2se, 102_3se on a surface of secondary beam-limit aperture plate 155. As shown, secondary beam-limit aperture 155A cuts off peripheral electrons of secondary electron beams 102_1se-102_3se. While FIGS. 4B-4C illustrate examples of a relatively sharp secondary beam crossover formed by fully overlapping secondary beams 102_1se-102_3se on one crossing plane, it is appreciated that one or more of the secondary electron beams may be offset from others on the crossing plane and the secondary beam crossover may not be that sharp. The offset may keep at least 80% of the electrons from the beam overlap with others.

In general, when the size of secondary beam-limit aperture 155A increases, the collection efficiencies of secondary electron beams 102_1se-102_3se increase, and the collection efficiency differences and cross-talk among secondary electron beams 102_1se-102_3se increase as well. When the collection efficiencies of secondary electron beams 102_1se-102_3se increase, the inspection throughput of the multi-beam inspection (MBI) apparatus increases. On the other side, when the collection efficiency differences of secondary electron beams 102_1se-102_3se increase, the grey levels of images formed by secondary electron beams 102_1se-102_3se differ more, which require one or more additional processes to eliminate the inspection errors due to the difference, thereby decreasing inspection throughput and deteriorating resolution of the MBI apparatus. When the cross-talk among secondary electron beams 102_1se-102_3se increases, the resolution of images formed by secondary electron beams 102_1se-102_3se reduces. That is, large cross-talk deteriorates inspection resolution of the MBI apparatus.

Figure 5A:
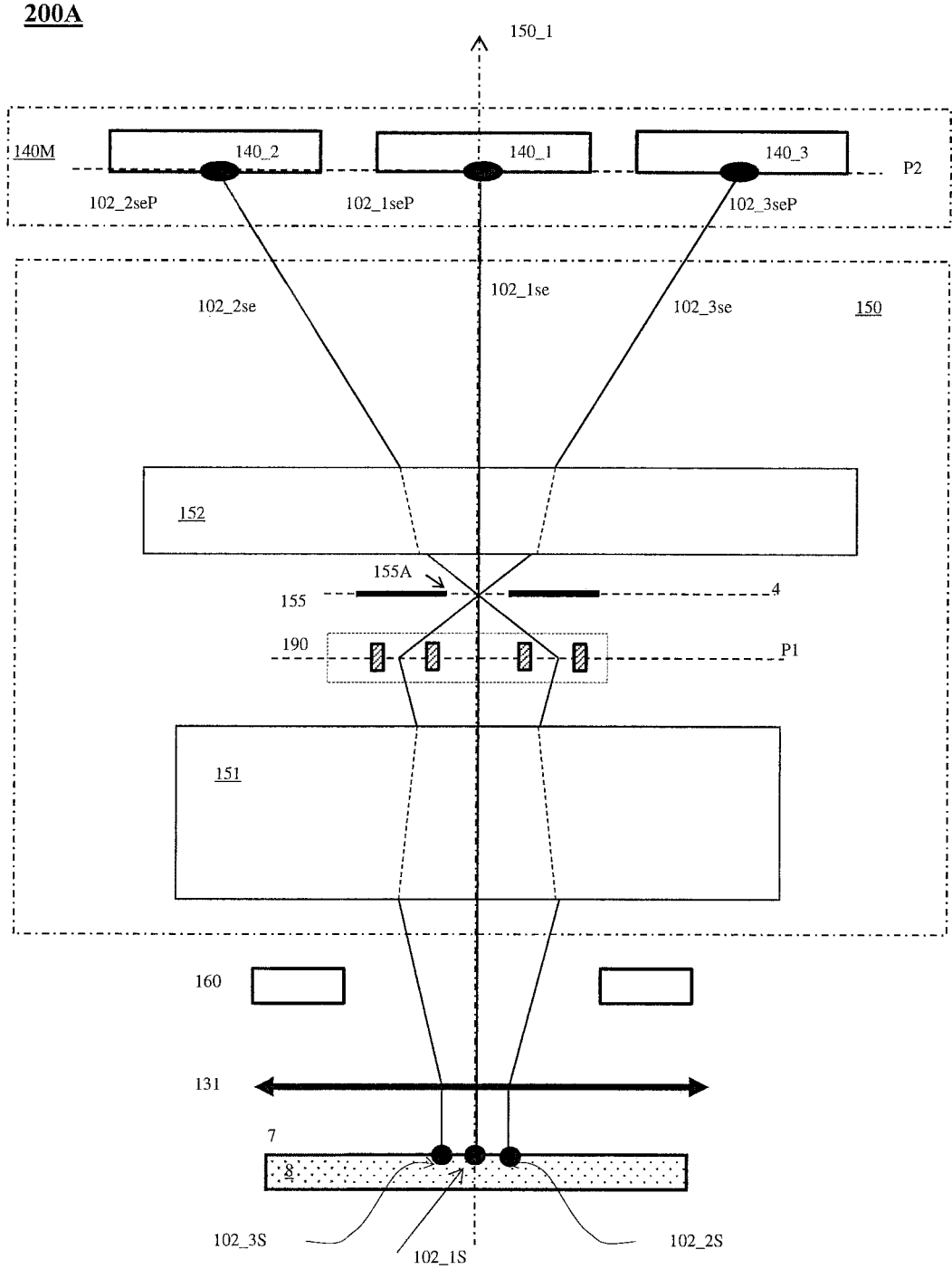
FIGS. 5A, 5B, and 5C are schematic diagrams illustrating exemplary configurations of secondary imaging system with deflectors, consistent with embodiments of the present disclosure.
Figure 5B:
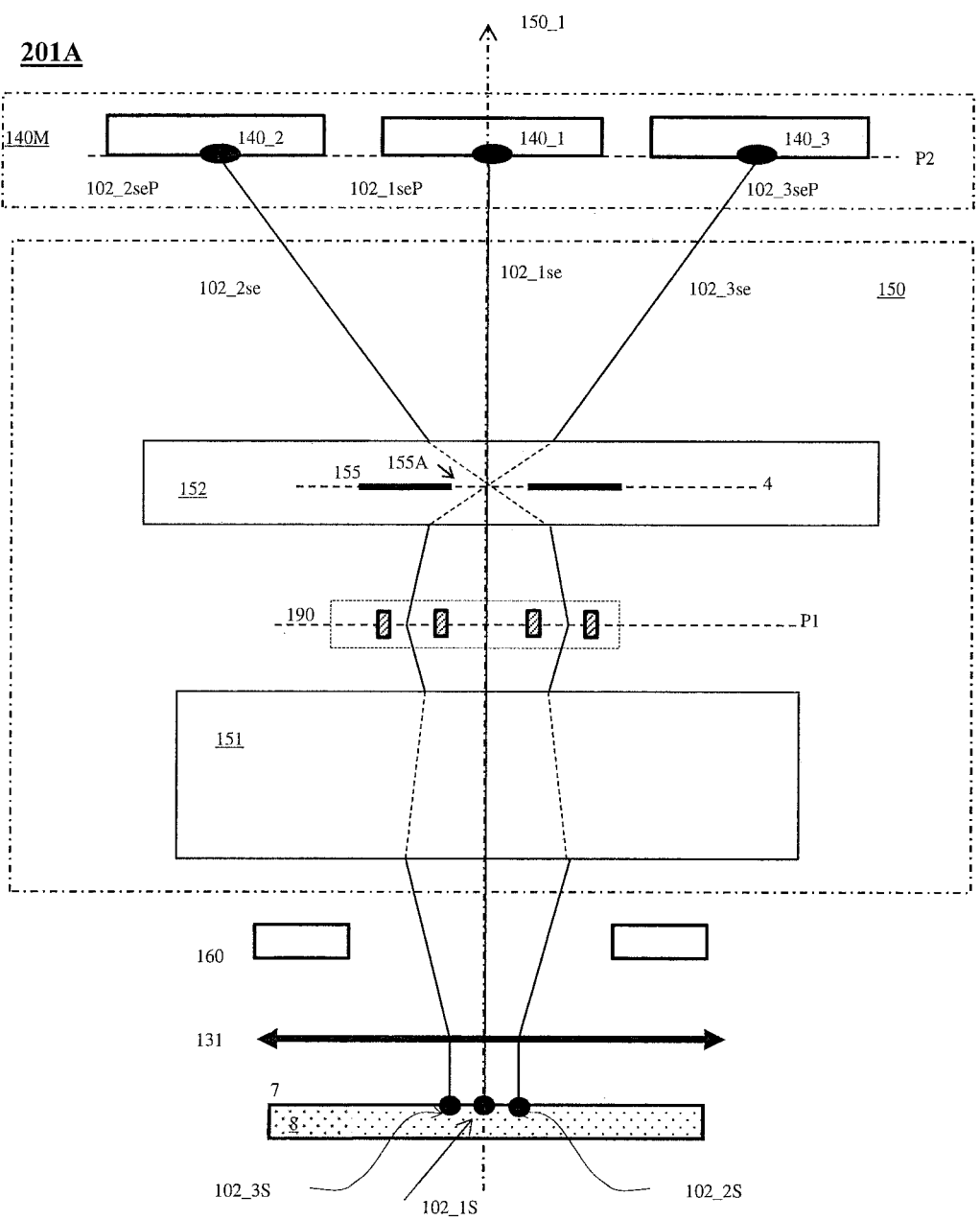
Figure 5C:
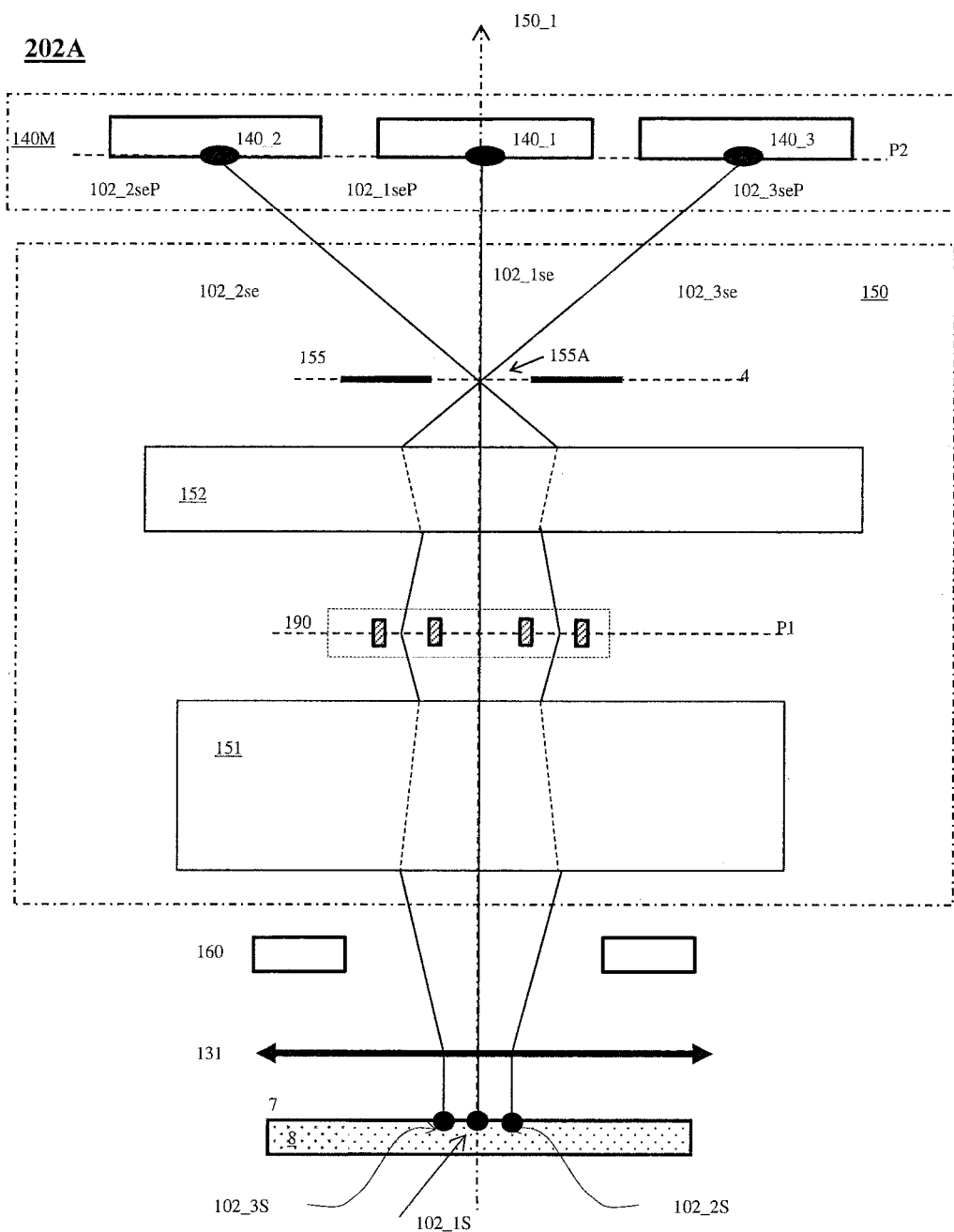

Reference is now made to FIGS. 5A, 5B, and 5C, which are schematic diagrams illustrating exemplary configurations of the secondary imaging system comprising deflectors, consistent with embodiments of the present disclosure.

Secondary imaging system 150 may comprise a first set of one or more lenses 151 and a second set of one or more lenses 152 (shown in FIGS. 5A, 5B, and 5C) that are arranged between beam separator 160 and electron detection device 140M, in which electron detection device 140M is positioned closer to second set of one or more lenses 152 than first set of one or more lenses 151. Each set comprises one or more lenses that together perform an optical function, such as magnifying, zooming, and image anti-rotating etc. For example, first set 151 may be configured to have a zooming function to reduce magnification variations of multiple secondary electron beams on one image plane. In particular, each set of one or more lenses 151 and 152 may be configured to form an image plane for secondary electron beams. For example, first set of one or more lenses 151 may be arranged to form an image plane P1 for secondary electron beams. As a result, deflectors may beneficially be positioned at or near image plane P1 to deflect secondary electron beams. Similarly, second set of one or more lenses 152 may be arranged to form an image plane P2 for secondary electron beams, such that, e.g. electron detection device 140M may be positioned at or near image plane P2 to form multiple images of sample 8, one image for each of the secondary electron beams.

In some embodiments, a crossover-forming deflector array 190 with multiple crossover-forming deflectors is arranged at or near image plane P1 after first set 151 along secondary optical axis 150_1. Each crossover-forming deflector in crossover-forming deflector array 190 may be aligned with a corresponding one of secondary electron beams 102_1se, 102_2se, 102_3se and may be configured to deflect the corresponding secondary electron beam to cross secondary optical axis 150_1 on crossing plane 4. Each crossover-forming deflector may, for example, be deflector D1 of FIG. 4A.

While FIGS. 5A-5C show crossover-forming deflectors in crossover-forming deflector array 190 associated with off-axis secondary electron beams 102_2se and 102_3se, it is appreciated that an additional deflector may also be used by on-axis secondary electron beam 102_1se.

The deflection of secondary electron beams 102_1se-102_3se ensure secondary electron beams 102_1se-102_3se form a relatively sharp secondary beam crossover at or near crossing plane 4. Beam-limit aperture plate 155 with a beam-limit aperture 155A is located at or near one crossing plane (e.g. crossing plane 4). While peripheral electrons of secondary electron beams 102_1se-102_3se are blocked off by beam-limit aperture plate 155, the center electrons of secondary electron beams 102_1se-102_3se pass through beam-limit aperture 155A.

The placement of beam-limit aperture plate 155 and crossing plane 4 may be designed at various locations, e.g. depending on the deflection angles and/or location of crossover-forming deflector array 190. For example, as shown in FIG. 5A, the placement of beam-limit aperture plate 155 and crossing plane 4 is located between first set of one or more lenses 151 and second set of one more lenses 152. In some embodiments, such as the exemplary configuration shown in FIG. 5B, the placement of beam-limit aperture plate 155 and crossing plane 4 is located inside second set of one more lenses 152. In some other embodiments, such as the exemplary configuration shown in FIG. 5C, the placement of beam-limit aperture plate 155 and crossing plane 4 is located between second set of one more lenses 152 and electron detection device 140M. A benefit of the configuration as shown in FIG. 5C is that the deflection angles of the individual crossover-forming deflectors in the crossover-forming deflector array 190 are relatively small. A benefit of such small deflection angles may be that the crossover-forming deflector array 190 may be easier to manufacture because lower electric excitation to each crossover-forming deflector is required. Furthermore, such configuration may be more power efficient.

Secondary imaging system 150 is configured to focus secondary electron beams 102_1se, 102_2se, and 102_3se from scanned regions of sample surface 7 onto corresponding detection elements 140_1, 140_2, and 140_3 of electron detection device 140M at image plane P2, and form secondary beam spots 102_1seP, 102_2seP and 102_3seP thereon respectively. Detection elements 140_1, 140_2, and 140_3 are configured to detect corresponding secondary electron beams 102_1se, 102_2se, and 102_3se and generate corresponding signals used to construct images of the corresponding scanned areas of sample surface 7. Based on the disclosed embodiments provided in secondary imaging system 150, the use of crossover-forming deflector array 190 in secondary imaging system 150 enables a reduction of the cross-talk between adjacent secondary electron beams, while improving the collection efficiency uniformity for secondary electron beams 102_1se-102_3se.

Figure 6:
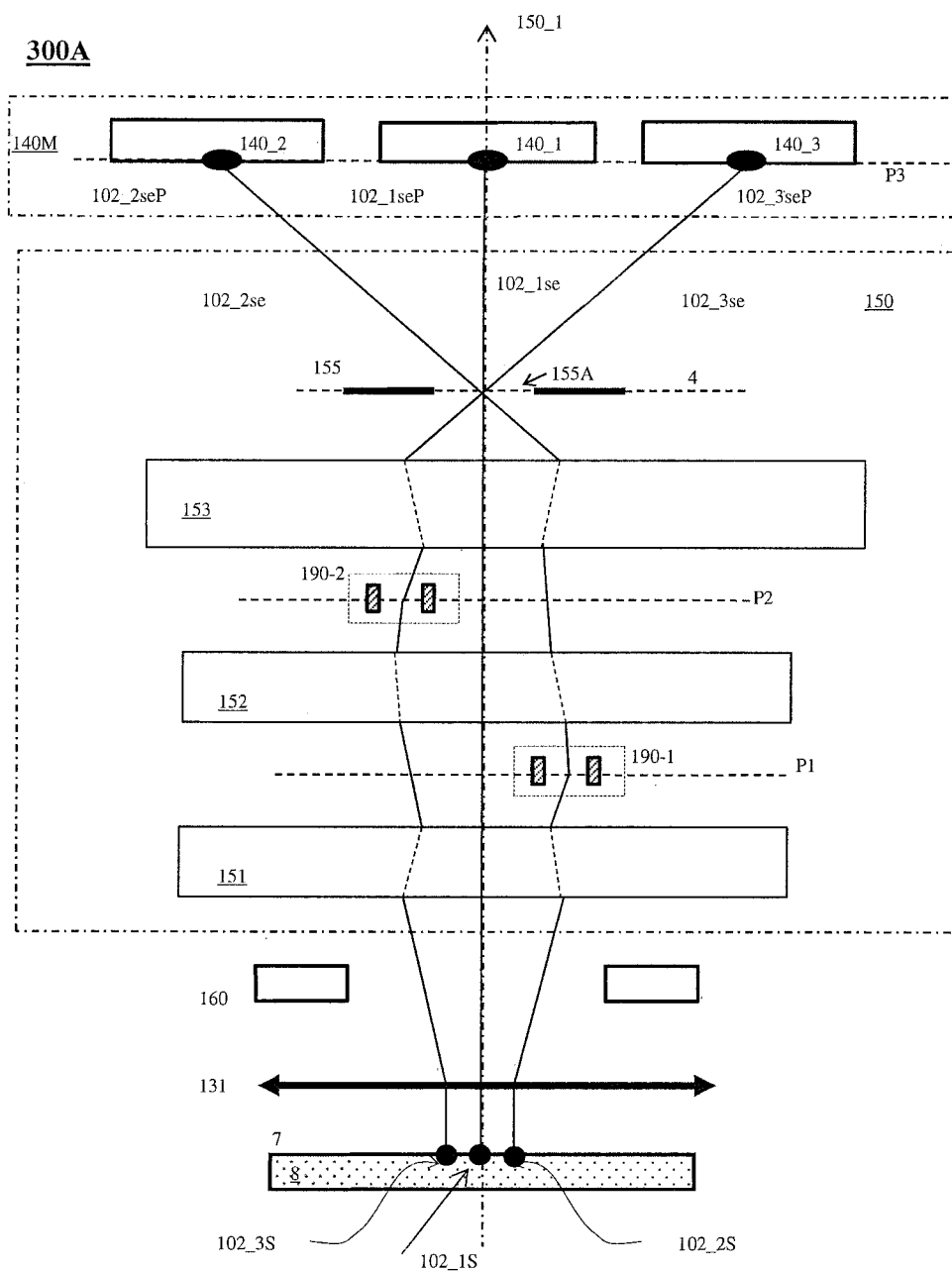
FIG. 6 is a schematic diagram illustrating an exemplary configuration of secondary imaging system with deflectors configured in multiple deflector arrays, consistent with embodiments of the present disclosure.

Reference is now made to FIG. 6, which is a schematic diagram illustrating an exemplary alternative configuration of secondary imaging system 150 comprising multiple crossover-forming deflector arrays to deflect secondary electron beams 102_1se-102_3se, consistent with embodiments of the present disclosure.

Secondary imaging system 150 includes multiple sets of one more lenses 151, 152, 153 arranged between beam separator 160 and electron detection device 140M. In these embodiments, first set of one more lenses 151 is configured to focus secondary electron beams 102_1se-102_3se onto image plane P1 arranged between first set of one more lenses 151 and second set of one more lenses 152. Second set of one more lenses 152 subsequently is configured to focus secondary electron beams 102_1se-102_3se onto image plane P2 arranged between second set of one more lenses 152 and a third set of one more lenses 153. Third set of one more lenses 153 finally focuses secondary electron beams 102_1se-102_3se onto image plane P3 where electron detection device 140M is positioned.

In some embodiments, secondary imaging system 150 may comprise more than one crossover-forming deflector array 190-1 and 190-2, with each array having one or more crossover-forming deflectors (e.g., deflector D1 of FIG. 4A). Crossover-forming deflector arrays 190-1 and 190-2 are placed at image planes P1 and P2, respectively. Crossover-forming deflector array 190-1 comprises crossover-forming deflectors that are aligned with and deflect first group (102_2se) of secondary electron beams 102_1se-102_3se on image plane P1, while not influencing other groups of secondary electron beams to pass through. Crossover-forming deflector array 190-2 comprises crossover-forming deflectors that are aligned with and deflect second group (102_3se) of secondary electron beams 102_1se-102_3se on image plane P2, while not influencing other groups of secondary electron beams to pass through. The individual deflection angles of the crossover-forming deflectors in crossover-forming deflector array 190_1 and 190_2 are configured such that all secondary electron beams 102_1se-102_3se cross secondary optical axis 150_1 at crossing plane 4 and form a relatively sharp crossover thereon. As stated above, it is appreciated that one of crossover-forming deflector arrays 190-1 and 190-2 may have a deflector corresponding to secondary electron beam 102_1se.

The placement of beam-limit aperture plate 155 and crossing plane 4 may be designed at various locations within secondary image system 150. For example, along secondary optical axis 150_1, the placement of beam-limit aperture plate 155 and crossing plane 4 may be placed between second and third sets of one or more lenses 152 and 153, inside third set of one more lenses 153, or after third set of one or more lenses 153 and before electron detection device 140M.

Figure 7:
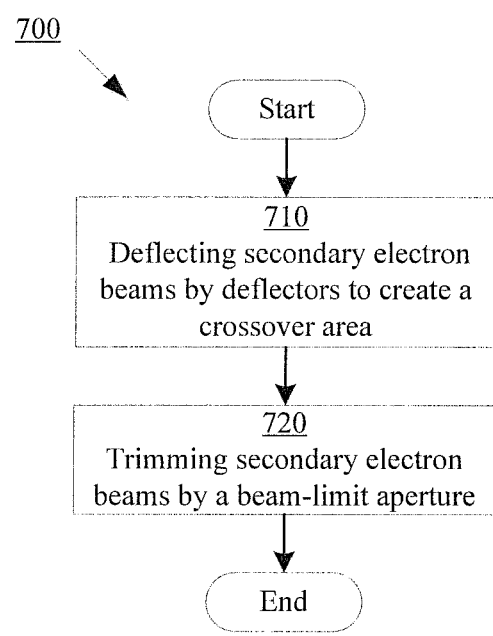
FIG. 7 is a flow chart illustrating an exemplary method for forming images of a surface of a sample, consistent with embodiments of the present disclosure.

FIG. 7 is a flow chart illustrating an exemplary method 700 for forming images of a surface of a sample, consistent with embodiments of the present disclosure. Method 700 may be performed by a secondary imaging system (e.g., secondary imaging system 150 of FIGS. 5A, 5B, 5C, and 6) after acquiring secondary electrons beams from sample.

In step 710, the secondary electron beams are deflected by a plurality of crossover-forming deflectors being positioned at or at least near one or more image planes to form a crossover area on a crossing plane. The secondary electron beams that are deflected may be all secondary electron beams acquired by the secondary imaging system or may be off-axis secondary electron beams.

In some embodiments, the secondary electron beams may be deflected at or at least near one image plane. Prior to being deflected, the secondary electron beams may pass through a first set of one or more lenses (e.g., first set of one or more lenses 151), which form a first image plane (e.g., image plane P1). The deflecting of the secondary electron beams occurs at or at least near the first image plane.

In some other embodiments, the secondary electron beams may be deflected at or at least near multiple image planes. In such embodiments, a first group of secondary electron beams are deflected by a first crossover-forming deflector array being positioned at or at least near the first image plane, while a second group of secondary electron beams are deflected by a second crossover-forming deflector array being positioned at or at least near a second image plane. Prior to being deflected, the first group of secondary electron beams may pass through the first set of one or more lenses (e.g., first set of one or more lenses 151), which form the first image plane (e.g., image plane P1). The deflecting of the first group of secondary electron beams occurs at or at least near the first image plane.

Prior to being deflected, the second group of secondary electron beams may pass through a second set of one or more lenses (e.g., second set of one or more lenses 152), which form the second image plane (e.g., image plane P2). The deflecting of the second group of secondary electron beams occurs at or at least near the second image plane.

In step 720, secondary electron beams are trimmed by a beam-limit aperture (e.g., beam-limit aperture 155A) positioned at or at least near the crossing plane associated with the crossover area. The trimming of the secondary electron beams may involve the trimming of the peripheral electrons of the secondary electron beams and may allow center electrons of secondary electron beams to pass through the beam-limit aperture.

In embodiments where the secondary electron beams are deflected at or at least near one image plane, the trimming of the secondary electron beams may occur at the crossing plane prior to a second set of one or more lenses forming an image plane (e.g., image plane P2 shown in FIG. 5A), within the second set of one or more lenses forming the image plane (e.g., image plane P2 shown in FIG. 5B), or after the second set of one or more lenses forming the image plane (e.g., image plane P2 shown in FIG. 5C).

In embodiments where the secondary electron beams are deflected at multiple image planes (such as image planes P1 and P2 shown in FIG. 6), the trimming of the secondary electron beams may occur at the crossing plane prior to a third set of one or more lenses (e.g., third set of one or more lenses 153) forming a third image plane (e.g., image plane P3), within the third set of one or more lenses forming the third image plane, or after the third set of one or more lenses forming the third image plane.

Figure 8:
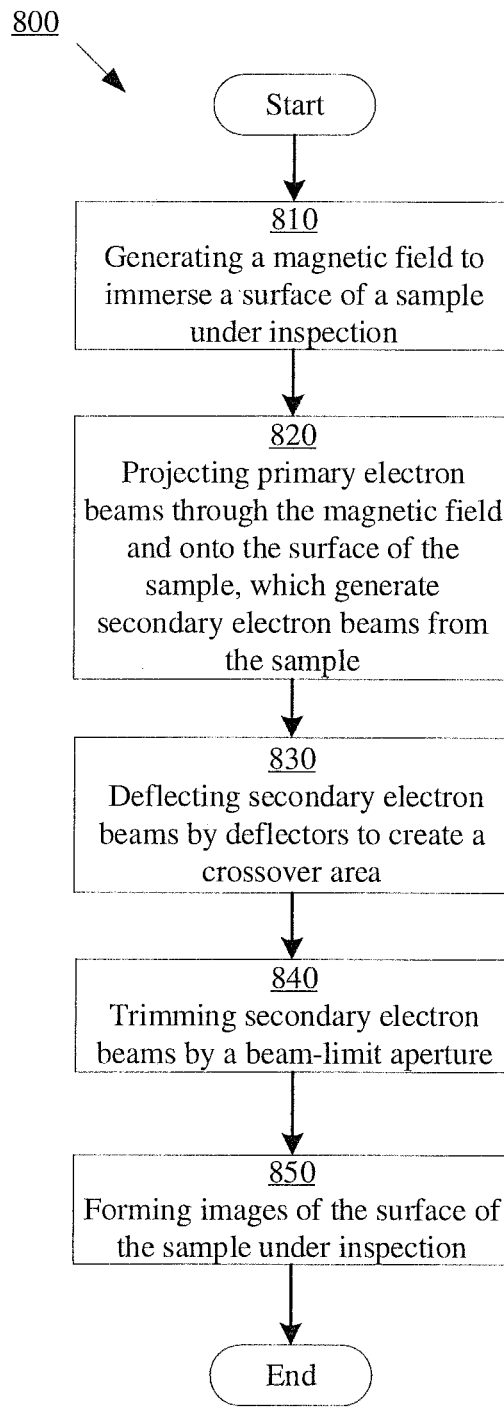
FIG. 8 is a flow chart illustrating an exemplary method for forming images of a sample using an electro-optical system, consistent with embodiments of the present disclosure.

Reference is now made to FIG. 8, which is a flow chart illustrating an exemplary method 800 of forming images of a sample using an electro-optical system, consistent with embodiments of the present disclosure. Method 800 may be performed by electron beam tool (e.g., electron beam tool 100 of FIG. 2).

In step 810, a magnetic field is generated to immerse a surface of a sample (e.g., surface 7 of sample 8). The magnetic field may be generated by a magnetic lens (e.g., magnetic lens 131M of FIG. 3A) of an objective lens (e.g., objective lens 131).

In step 820, a plurality of electron beams are projected through the magnetic field of the objective lens onto the surface, wherein the plurality of electron beams illuminates the surface of the sample to generate secondary electron beams from the surface. These multiple secondary electron beams pass through the objective lens and a secondary imaging system to form a plurality of secondary electron beam spots on an electron detection device.

The formation of the plurality of secondary electron beam spots includes step 830 involving a deflecting of secondary electron beams by deflectors to create a crossover area and step 840 involving a trimming of secondary electron beams by a beam-limit aperture. Steps 830 and 840 may be similar to steps 710 and 720 of FIG. 7.

In step 850, the plurality of secondary electron beam spots is detected by a plurality of detection elements (e.g., detection elements 140_1-140_3) of the electron detection device (e.g., electron detection device 140M) and form a plurality images of the sample.

The embodiments may further be described using the following clauses:

1. A crossover-forming deflector array of an electro-optical system for directing a plurality of electron beams onto an electron detection device, the crossover-forming deflector array comprising:
   a plurality of crossover-forming deflectors positioned at or at least near an image plane of a set of one or more electro-optical lenses of the electro-optical system, wherein each crossover-forming deflector is aligned with a corresponding electron beam of the plurality of electron beams.
2. The crossover-forming deflector array of clause 1, wherein each crossover-forming deflector is configured to deflect a corresponding electron beam so that all electron beams overlap to form a crossover area on a crossing plane.
3. The crossover-forming deflector array of clause 1, wherein each crossover-forming deflector has a multi-pole structure.
4. An electro-optical system for projecting a plurality of secondary electron beams from a sample onto respective electron detection surfaces in a multi-beam apparatus, the electro-optical system comprising:
   a plurality of crossover-forming deflectors configured to create a crossover area on a crossing plane for the plurality of secondary electron beams, wherein each crossover-forming deflector of the plurality of crossover-forming deflectors is associated with a corresponding secondary electron beam of the plurality of secondary electron beams
   a beam-limit aperture plate with one or more apertures, positioned at or near the crossing plane, and configured to trim the plurality of secondary electron beams.
5. The electro-optical system of clause 4, wherein the plurality of crossover-forming deflectors are configured to deflect off-axis secondary electron beams of the plurality of secondary electron beams to the crossover area.
6. The electro-optical system any one of clauses 4 and 5, wherein the one or more apertures include a first aperture centered with the crossover area.
7. The electro-optical system of any one of clauses 4 to 6, wherein the one or more apertures are configured to have different sizes.
8. The electro-optical system of any one of clauses 6 and 7, wherein the beam-limit aperture plate is moveable to align a second aperture of the one or more apertures with the crossover area.
9. The electro-optical system of any one of clauses 4 to 8, further comprising:
   an electron detection device including the detection surfaces for the plurality of secondary electron beams to form a plurality of images of the sample.
10. The electro-optical system of clause 9, further comprising:
    a first set of one or more lenses and a second set of one or more lenses aligned with an optical axis of the electro-optical system, wherein the electron detection device is positioned closer to the second set than the first set.
11. The electro-optical system of clause 10, wherein the plurality of crossover-forming deflectors are positioned at or at least near a first image plane of the first set between the first set and the second set.
12. The electro-optical system of clause 11, wherein the first set of one or more lenses is configured to align at least some of the plurality of secondary electron beams with a corresponding crossover-forming deflector of the plurality of crossover-forming deflectors.
13. The electro-optical system of any one of clauses 11 and 12, wherein the crossing plane is positioned between the first set and the second set.
14. The electro-optical system of any one of clauses 11 and 12, wherein the crossing plane is positioned between the electron detection device and the second set.
15. The electro-optical system of any one of clauses 11 and 12, wherein the crossing plane is positioned within the second set
16. The electro-optical system of clause 10, further comprising a third set of one or more lenses aligned with the optical axis of the electro-optical system and positioned between the second set and the electron detection device, wherein a first set of crossover-forming deflectors of the plurality of crossover-forming deflectors is positioned at or at least near a first image plane of the first set of one or more lenses between the first set of one more lenses and the second set of one or more lenses and a second set of crossover-forming deflectors of the plurality of crossover-forming deflectors is positioned at or at least near a second image plane of the second set of one or more lenses between the second set of one or more lenses and the third set of one or more lenses.
17. The electro-optical system of clause 16, wherein the first set of crossover-forming deflectors and the second set of crossover-forming deflectors are configured to deflect corresponding secondary electron beams to overlap to form the crossover area at the crossing plane.
18. The electro-optical system of clause 17, wherein the crossing plane is positioned between the electron detection device and the third set of one or more lenses.
19. The electro-optical system of clause 17, wherein the crossing plane is positioned within the third set of one or more lenses.
20. The electro-optical system of any one of clauses 10 to 19, wherein at least one of the first set of one or more lenses and the second set of one or more lenses is configured to compensate a rotation of the plurality of secondary electron beams before each secondary election beam of the plurality of secondary electron beams reaches a corresponding crossover-forming deflector.
21. The electro-optical system of any one of clauses 4 to 21, wherein the electro-optical system is configured to image secondary electron beams onto the detection surfaces under a presence of an objective lens configured to immerse the sample with a magnetic field of the objective lens.
22. The electro-optical system of any one of clauses 16 to 21, wherein the first set of one or more lenses and the second set of one or more lenses are configured to align at least some of the plurality of secondary electron beams with a corresponding crossover-forming deflector of the plurality of crossover-forming deflectors.

23. The electro-optical system of clause 22, wherein at least one of the first set of one or more lenses and the second set of one or more lenses is configured to compensate a displacement of the plurality of secondary electron beams before each secondary electron beam of the plurality of secondary electron beams reaches a corresponding crossover-forming deflector.

24. A method performed by a secondary imaging system to form images of a sample, the method comprising:
  deflecting secondary electron beams by a plurality of crossover-forming deflectors being positioned at or at least near one or more image planes of the secondary imaging system to form a crossover area on a crossing plane; and
  trimming secondary electron beams by a beam-limit aperture plate with a beam-limit aperture positioned at or at least near the crossing plane.

25. The method of clause 24, wherein trimming secondary electron beams includes blocking off peripheral portion of each of the secondary electron beams by the beam-limit aperture plate.

26. The method of any one of clauses 24 and 25, wherein trimming secondary electron beams allows central portion of each of the secondary electron beams to pass through the beam-limit aperture.

27. The method of any one of clauses 24 to 26, further comprising:
  forming, by a first set of one or more lenses, a first image plane of the one or more image planes; and
  forming, by a second set of one or more lenses, a second image plane of the one or more image planes.

28. The method of clause 27, wherein deflecting secondary electron beams by one or more deflectors being positioned at least near one or more image planes to form a crossover area further comprises:
  deflecting secondary electron beams by the plurality of crossover-forming deflectors being positioned at or at least near the first image plane.

29. The method of any one of clauses 27 and 28, wherein trimming secondary electron beams occurs before the second set forms the second image plane for the secondary electron beams.

30. The method of any one of clauses 27 and 28, wherein trimming secondary electron beams occurs after the second set forms the second image plane for the secondary electron beams.

31. The method of any one of clauses 27 and 28, wherein trimming secondary electron beams occurs during the second set forming the second image plane for the secondary electron beams.

32. The method of clause 27, further comprising:
  forming, by a third set of one or more lenses, a third image plane of the one or more image planes.

33. The method of clause 32, wherein deflecting secondary electron beams by one or more crossover-forming deflectors being positioned at or at least near one or more image planes to form a crossover area further comprises:
  deflecting a first set of secondary electron beams of the secondary electron beams by a first set of crossover-forming deflectors being positioned at or at least near the first image plane; and
  deflecting a second set of secondary electron beams of the secondary electron beams by a second set of crossover-forming deflectors being positioned at or at least near the second image plane.

34. The method of any one of clauses 32 and 33, wherein trimming secondary electron beams occurs before the third set forms the third image plane for the secondary electron beams.

35. The method of any one of clauses 32 and 33, wherein trimming secondary electron beams occurs after the third set forms the third image plane for the secondary electron beams.

36. The method of any one of clauses 32 and 33, wherein trimming secondary electron beams occurs during the third set forming the third image plane for the secondary electron beams.

37. A method to form images of a sample using an electro-optical system comprising:
  generating a magnetic field to immerse a surface of the sample;
  projecting a plurality of primary electron beams onto the surface of the sample by a primary projection imaging system, wherein the plurality of primary electron beams pass through the magnetic field and generate a plurality of secondary electron beams from the sample; and
  projecting, by a secondary imaging system, the plurality of secondary electron beams onto an electron detection device to obtain the images, wherein at least some of the plurality of secondary electron beams are deflected for creating a crossover area and are trimmed at or at least near to the crossover area.

38. A non-transitory computer readable medium including a set of instructions that is executable by one or more processors of a controller causing the controller to perform a method to form images of a sample using an electro-optical system, the method comprising:
  providing instructions to cause a plurality of crossover-forming deflectors being positioned at or at least near one or more image planes of the system to deflect secondary electron beams to form a crossover area; and
  providing instructions to cause a beam-limit aperture to trim the deflected secondary electron beams at or at least near to the crossover area.

39. A non-transitory computer readable medium including a set of instructions that is executable by one or more processors of a controller causing the controller to perform a method forming images of a sample, the method comprising:
  instructing an objective lens to generate a magnetic field to immerse a surface of the sample;
  instructing a primary imaging system to project a plurality of primary electron beams onto the surface of the sample, wherein the plurality of primary electron beams pass through the magnetic field and generate a plurality of secondary electron beams from the sample; and
  instructing a secondary imaging system to project the plurality of secondary electron beams onto an electron detection device to obtain the images, wherein at least some of the plurality of secondary electron beams are deflected for creating a crossover area and are trimmed at or at least near the crossover area.

It is appreciated that a controller of the multi-beam apparatus could use software to control the functionality described above. For example, the controller may send instructions to the aforementioned lenses to generate an appropriate field (e.g., magnetic or electrostatic field), respectively. The controller may also send instructions to adjust voltages to control the aforementioned deflector arrays. The software may be stored on a non-transitory computer readable medium. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM or any other flash memory, NVRAM, a cache, a register, any other memory chip or cartridge, and networked versions of the same.

Although the present invention has been explained in relation to its preferred embodiments, it is to be understood that other modifications and variation can be made without departing the spirit and scope of the invention as hereafter claimed.

What is claimed is:

1. A method to form images of a sample using an electro-optical system comprising:
    generating a magnetic field to immerse a surface of the sample;
    projecting a plurality of primary electron beams onto the surface of the sample by a primary projection imaging system, wherein the plurality of primary electron beams pass through the magnetic field and generate a plurality of secondary electron beams from the sample; and
    projecting, by a secondary imaging system, the plurality of secondary electron beams onto an electron detection device to obtain the images, wherein at least some of the plurality of secondary electron beams are deflected for creating a crossover area and are trimmed at or at least near to the crossover area.

2. The method of claim 1, further comprising controlling a plurality of crossover-forming deflectors to deflect the at least some of the plurality of secondary electron beams to reduce skews in trajectories of those secondary electron beams, wherein the skews are caused by the magnetic field around the surface of the sample.

3. The method of claim 2, wherein the plurality of crossover-forming deflectors comprise multi-pole structures.

4. The method of claim 3, wherein controlling the plurality of crossover-forming deflectors includes changing voltages applied to poles of the corresponding multi-pole structure.

5. The method of claim 1, wherein the peripheral portion of the at least some of the plurality of secondary electron beams are blocked off by a beam-limit aperture plate.

6. The method of claim 5, wherein the beam-limit aperture plate includes a beam-limit aperture, and trimming the plurality of secondary electron beams allows central portion of each of the plurality of secondary electron beams to pass through the beam-limit aperture.

7. The method of claim 6, wherein the beam-limit aperture plate is positioned at the crossover area.

8. The method of claim 6, wherein the beam-limit aperture plate is positioned at least near the crossover area.

9. A non-transitory computer readable medium storing a set of instructions that is executable by one or more processors of a charged particle beam system, including a primary projection imaging system and a secondary imaging system, to cause the charge particle beam system to perform a method to form images of a sample, the method comprising:
    generating a magnetic field to immerse a surface of the sample;
    projecting a plurality of primary electron beams onto the surface of the sample by a primary projection imaging system, wherein the plurality of primary electron beams pass through the magnetic field and generate a plurality of secondary electron beams from the sample; and
    projecting, by a secondary imaging system, the plurality of secondary electron beams onto an electron detection device to obtain the images, wherein at least some of the plurality of secondary electron beams are deflected for creating a crossover area and are trimmed at or at least near to the crossover area.

10. The computer readable medium of claim 9, wherein the set of instructions that is executable by the one or more processors of the charged particle beam system to cause the charge particle beam system to perform the method to form images of the sample, the method further comprising controlling a plurality of crossover-forming deflectors to deflect the at least some of the plurality of secondary electron beams to reduce skews in trajectories of those secondary electron beams, wherein the skews are caused by the magnetic field around the surface of the sample.

11. The computer readable medium of claim 10, wherein the plurality of crossover-forming deflectors comprise multi-pole structures.

12. The computer readable medium of claim 11, wherein controlling the plurality of crossover-forming deflectors includes changing voltages applied to poles of the corresponding multi-pole structure.

13. The computer readable medium of claim 9, wherein the peripheral portion of the at least some of the plurality of secondary electron beams are blocked off by the beam-limit aperture plate.

14. The computer readable medium of claim 13, wherein the beam-limit aperture plate includes a beam-limit aperture, and trimming the plurality of secondary electron beams allows central portion of each of the plurality of secondary electron beams to pass through the beam-limit aperture.

15. The computer readable medium of claim 14, wherein the beam-limit aperture plate is positioned at the crossover area.

16. The computer readable medium of claim 14, wherein the beam-limit aperture plate is positioned at least near the crossover area.

17. An electro-optical system for forming images of a sample comprising:
    an objective lens configured to generate a magnetic field to immerse a surface of the sample;
    a primary projection imaging system configured to project a plurality of primary electron beams onto the surface of the sample, wherein the plurality of primary electron beams pass through the magnetic field and generate a plurality of secondary electron beams from the sample; and
    a secondary imaging system configured to project the plurality of secondary electron beams onto an electron detection device to obtain the images, wherein at least some of the plurality of secondary electron beams are deflected for creating a crossover area and are trimmed at or at least near to the crossover area.

18. The system of claim 16, wherein at least some of a plurality of crossover-forming deflectors are configured to be controlled to adjust deflection angles of the corresponding secondary electron beams to reduce skews in trajectories of the corresponding secondary electron beams, wherein the skews are caused by the magnetic field around the surface of the sample.

19. The system of claim 17, wherein the plurality of crossover-forming deflectors comprise multi-pole structures.

20. The system of claim 18, wherein the multi-pole structures are configured to be controlled by adjusting voltages applied to poles of the corresponding multi-pole structure.

21. The system of claim 16, wherein the peripheral portion of the at least some of the plurality of secondary electron beams are blocked off by a beam-limit aperture plate.

22. The system of claim 20, wherein the beam-limit aperture plate includes a beam-limit aperture enabling central portion of each of the plurality of secondary electron beams to pass through.

23. The system of claim 21, wherein the beam-limit aperture plate is positioned at the crossover area.

24. The system of claim 21, wherein the beam-limit aperture plate is positioned at least near the crossover area.

* * * * *